(12) United States Patent
Chen et al.

(10) Patent No.: US 6,255,188 B1
(45) Date of Patent: Jul. 3, 2001

(54) METHOD OF REMOVING A POLYSILICON BUFFER USING AN ETCHING SELECTIVITY SOLUTION

(75) Inventors: Chien-Hung Chen, Yun-Ho; Leon Chang; Wei-Shang King, both of Taipei, all of (TW)

(73) Assignee: Mosel Vitelic, Inc., Hsinchu (TW)

( * ) Notice: Subject to any disclaimer, the term of this patent is extended or adjusted under 35 U.S.C. 154(b) by 0 days.

(21) Appl. No.: 09/264,600

(22) Filed: Mar. 8, 1999

(30) Foreign Application Priority Data

Aug. 28, 1998 (TW) ................................................ 87114239

(51) Int. Cl.$^7$ ................................................... H01L 21/76
(52) U.S. Cl. ........................ 438/400; 438/444; 438/446; 438/42
(58) Field of Search ............................. 438/42, 43, 400, 438/439, 443, 444, 446, 970

(56) References Cited

U.S. PATENT DOCUMENTS 4,789,426 * 12/1988 Pipkin .

* cited by examiner

Primary Examiner—Kevin M. Picardat
Assistant Examiner—D. M. Collins
(74) Attorney, Agent, or Firm—Chien-Wei Chris Chou; Justin Boyce; Oppenheimer Wolff & Donnelly LLP

(57) ABSTRACT

A method of removing a polysilicon buffer in a method of forming a field oxide and an active area is disclosed herein that comprises the step of applying an etching selectivity solution to the polysilicon buffer to substantially remove the polysilicon buffer without substantially affecting the field oxide, a pad oxide, and the substrate. An etching selectivity solution is defined herein is a solution that has an etching rate for one material that is higher than for another material. In this case, the etching selectivity solution has an etching rate for polysilicon material that is higher than its etching rate for field oxide material. Accordingly, when the etching selectivity solution is applied to the polysilicon buffer, it will substantially etch off the polysilicon buffer without substantially affecting the field oxide. In the preferred embodiment, the etching selectivity solution comprises a mixture of HF and $HNO_3$, or HF, $HNO_3$ and $CH_3COOH$. The advantage of this method is that it reduces the likelihood of the formation of pits within the field oxide, pad oxide and the substrate. Consequently, the charge-to-breakdown voltage for the device is not degraded because of the absence of the pits. In addition, methods of forming a field oxide and an active area are disclosed herein that uses at least in part the disclosed method of removing a polysilicon buffer.

29 Claims, 4 Drawing Sheets

METHOD OF REMOVING A POLYSILICON BUFFER USING AN ETCHING SELECTIVITY SOLUTION

FIELD OF THE INVENTION

This invention relates generally to the manufacturing of integrated circuits, and in particular, to a method of removing a polysilicon buffer using an etching selectivity solution as part of a process of forming a field oxide and an active area.

BACKGROUND OF THE INVENTION

The trend today in the design of integrated circuits is to incorporate more devices within a given real estate. Accordingly, many integrated circuit designers focus their development work on new techniques that would increase the device density of integrated circuits. Many of these techniques are directed at reducing the size of the active area of each of the devices in an integrated circuit. In addition, some of the techniques are directed at reducing the size of the isolation area between adjacent active areas. Both of these efforts are conducted with the goal that the performance or properties of the resulting integrated circuits are not significantly compromised, although the overall size of the integrated circuits is reduced.

FIG. 1A illustrates a cross-sectional view of a portion of an integrated circuit 10 as typically manufactured in the prior art. The devices (components) of the integrated circuit 10 are typically formed using a substrate 12. For simplicity, the integrated circuit 10 can be subdivided into two regions. A first region comprises an active area 14 for use in forming the devices that make up the operational aspect of the integrated circuit 10, as well as a second region that comprises a field oxide 16 that provides isolation between adjacent active areas. The active area 14 typically includes thin-film layers formed on and above the substrate 12, such as pad oxide layer 18 (e.g. $SiO_2$) formed on and above the substrate 12 and silicon nitride layer ($Si_3N_4$) 20 formed on and above the pad oxide layer 18, as well as ion implanted (doped) regions (not shown) formed within the substrate 12.

FIG. 1B illustrates a blow-up view of the interface of the active area 14 and the field oxide 16 of the cross-sectional view of integrated circuit 10 as depicted in FIG. 1A. The interface of the active area 14 and the field oxide 16 involves the transition 22 of the pad oxide region 18 into the field oxide region 16. Because the pad oxide 18 is typically thinner than the field oxide 16, the transition or interface 22 between the pad oxide 18 and the field oxide 16 is typically characterized by a graduated decrease in thickness as it extends from the field oxide 16 to the pad oxide 18. This transition or interface is typically referred in the relevant art as a "bird's beak" 22 because of its resemblance to the shape of a bird's beak.

As it was previously discussed, the trend today in the design of integrated circuit is to reduce the size of the device active area along with the size of the field oxide to further densify the integrated circuit. Another technique involved is to shorten the transition 22 between the pad oxide 18 and the field oxide 16, i.e., to shorten the length of the bird's beak 22. However, shortening the length of the bird's beak 22 may compromise other desirable properties of the integrated circuit 10. Usually, there is a tradeoff between the desired length of the bird's beak 22 and the desired characteristic of the integrated circuit 10.

Thus, a compromise needs to be reached as to the length of the bird's beak 22 in order to achieve the desired size requirement for the integrated circuit without significantly affecting the characteristics or performance of the integrated circuit. Prior art techniques have been developed at forming the field oxide and active area in order to achieve the desired bird's beak characteristic.

FIGS. 2A–2C illustrate cross-sectional views of an integrated circuit 50 at sequential steps of part of a prior art method of forming a field oxide and active area. The part of the prior art method of forming a field oxide and active area described with reference to FIGS. 2A–2C relates to the removal of the oxidation mask and polysilicon buffer, after the field oxide is formed. In other words, this part concerns the "clean up" part of the prior art method of forming the field oxide and active area. Accordingly, as illustrated in FIG. 2A, the integrated circuit 50 prior to the "clean up" part of the prior art method of forming the field oxide and active area comprises a substrate 52, a field oxide 54 and an active area 56. At this stage, the active area 56 includes a pad oxide layer 58 formed on and above the substrate 52, a polysilicon buffer 60 formed on and above the pad oxide 58, and a silicon nitride ($Si_3N_4$) oxidation mask 62 formed on and above the polysilicon buffer 60, Next, we photolithography to define the active area 56, followed with thermal growth to form the field oxide 54.

As illustrated in FIG. 2B, a first procedure in the "clean up" part of the prior art method of forming the field oxide and active area is to remove the silicon nitride ($Si_3N_4$) oxidation mask 62 and the polysilicon buffer 60. In the prior art, the removal of the silicon nitride ($Si_3N_4$) oxidation mask 62 and the polysilicon buffer 60 is typically performed by either standard dry or wet etching techniques. However, these techniques can have adverse effects on the field oxide 54, the pad oxide 58, and the substrate 52.

As illustrated in FIG. 2C, the removal of the polysilicon buffer 60, in particular with the use of standard dry etching techniques, can cause the formation of pits 64 within the field oxide 54, the pad oxide 58, and the substrate 52. These pits 64 can result in potential adverse effects on the performance of the integrated circuit 50. In particular, the pits 23 can increase the leakage current through the field oxide 54, and therefore, diminish the isolation properties of the field oxide 54. In addition, the pits 64 can reduce the charge-to-breakdown voltage (Qbd) of the gate oxide. Thus, there is need for a method of forming a field oxide and active area, or a method of removing the polysilicon buffer 60, without the substantial formation of these pits 64.

SUMMARY OF THE INVENTION

One aspect of the invention is a method of removing a polysilicon buffer in a process of forming a field oxide and an active area, using an etching selectivity solution. As it was previously discussed, one method of forming a field oxide and an active area involves a "clean up" step after the field oxide has been formed, comprising the steps of removing a silicon nitride ($Si_3N_4$) oxidation mask and a polysilicon buffer, both of which are situated within the active area. The prior art methodology of removing these materials from the active area involved either standard dry or wet etching techniques. However, one drawback of these standard techniques is that pits would typically form within the field oxide, the pad oxide and/or the substrate. Such pits in the field oxide, the pad oxide and/or the substrate have adverse effects on the performance of the devices formed using the prior art methodology, such as for example increased leakage current and a decrease in the charge-to-breakdown Qbd voltage.

The method of removing a polysilicon buffer in a process of forming a field oxide and an active area in accordance with the invention has the advantage of reducing or even eliminating the formation of the pits in the field oxide, the pad oxide and/or the substrate. As a result, integrated circuits and devices formed using the methodology of the invention typically have lower leakage currents and increased charge-to-breakdown Qbd voltages. Accordingly, the integrated circuits and/or devices formed using the methodology of the invention are typically more reliable and have improved performance over those formed using prior art methodology.

Briefly, the method of removing a polysilicon buffer in a process of forming a field oxide and an active area in accordance with the invention comprises the step of applying an etching selectivity solution to the polysilicon buffer to achieve the removal of the polysilicon buffer without substantially affecting the field oxide, the pad oxide and/or the substrate. An etching selectivity solution as defined herein is a solution that has an etching rate constant for one material that is substantially higher than for another material. In this case, the etching selectivity solution has an etching rate constant for polysilicon material that is higher than its etching rate constant for field oxide, pad oxide and/or the substrate. Accordingly, when the etching selectivity solution is applied to the polysilicon buffer, it will substantially etch off the polysilicon buffer without substantially affecting the field oxide. In the preferred embodiment, the etching selectivity solution comprises a mixture of HF and $HNO_3$. Alternatively, the etching selectivity solution is a combination of any combination from the group comprising HF, $HNO_3$ and $CH_3COOH$.

Another aspect of the invention involves a method of forming a field oxide and an active area. This method also uses at least a portion of the method of removing a polysilicon buffer in accordance with the invention. Briefly, the method of forming a field oxide and an active area comprises the steps of (1) forming a layer of silicon dioxide over a substrate; (2) forming a layer of polysilicon over the silicon dioxide layer; (3) forming a layer of silicon nitride over the polysilicon layer; (4) substantially removing the silicon nitride and polysilicon layers over the substrate in a region where the field oxide is to be formed, wherein at least a portion of the remaining silicon nitride layer and remaining polysilicon layer form respectively a silicon nitride oxidation mask and a polysilicon buffer configured in a substantially stacked manner to substantially define the active area; (5) forming a field oxide in the field oxide region; (6) substantially removing the silicon nitride oxidation mask; and (7) applying an etching selectivity solution to the polysilicon buffer to substantially remove the polysilicon buffer without substantially affecting the field oxide.

Yet another aspect of the invention involves another method of forming a field oxide and an active area for an integrated circuit. This method also uses at least a portion of the method of removing a polysilicon buffer in accordance with the invention. Briefly, the method comprises the steps of forming a polysilicon buffer and an oxidation mask over a substrate in a substantially stacked arrangement proximate a region of the substrate where the field oxide is to be formed; forming a field oxide within the field oxide region; substantially removing the oxidation mask; and substantially removing the polysilicon buffer using an etching selectivity solution.

IN THE DRAWINGS

DETAILED DESCRIPTION OF THE PREFERRED EMBODIMENTS

Figure 1A:
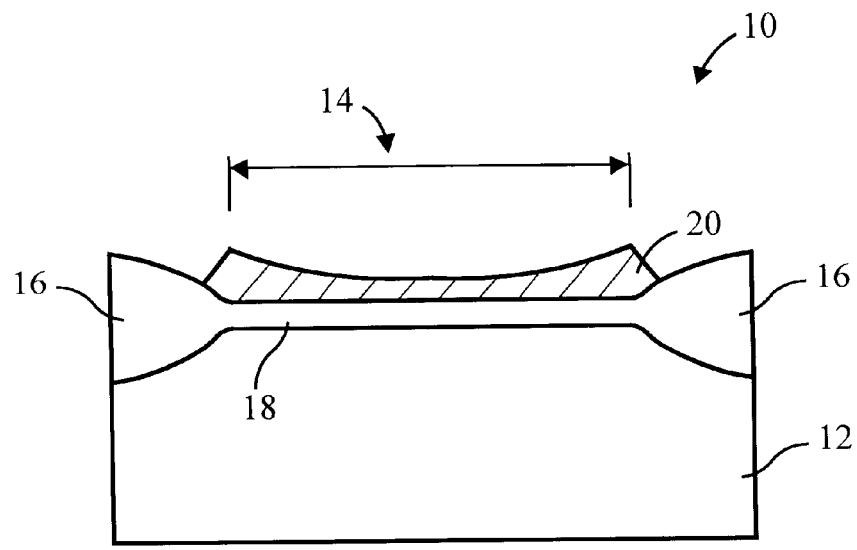
FIG. 1A illustrates a cross-sectional view of a portion of an integrated circuit as typically manufactured in the prior art.
Figure 1B:
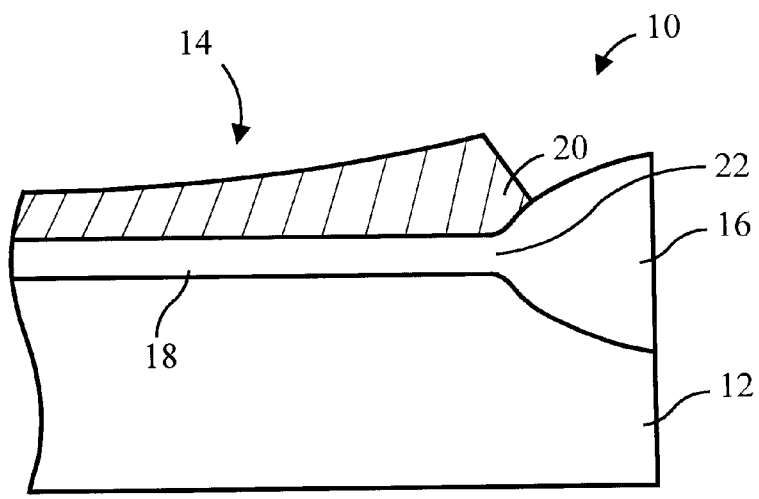
FIG. 1B illustrates a blow-up view of the interface of the active area and the field oxide of the cross-sectional view of the integrated circuit depicted in FIG. 1A.
Figure 2A:
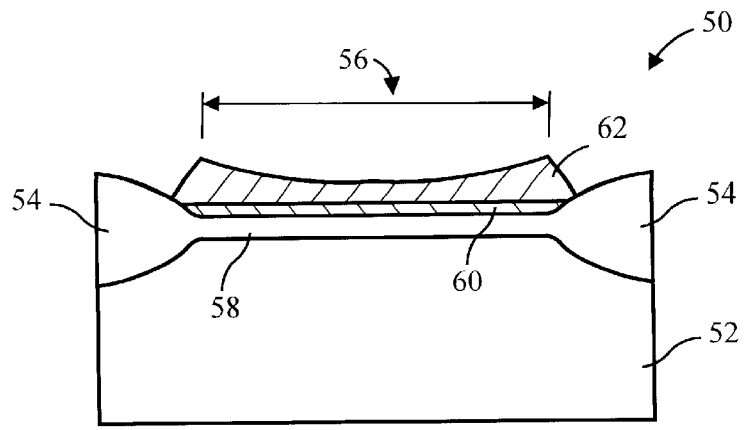
FIGS. 2A–2C illustrate cross-sectional views of an integrated circuit at sequential steps of part of a prior art method of forming a field oxide and an active area.
Figure 2B:
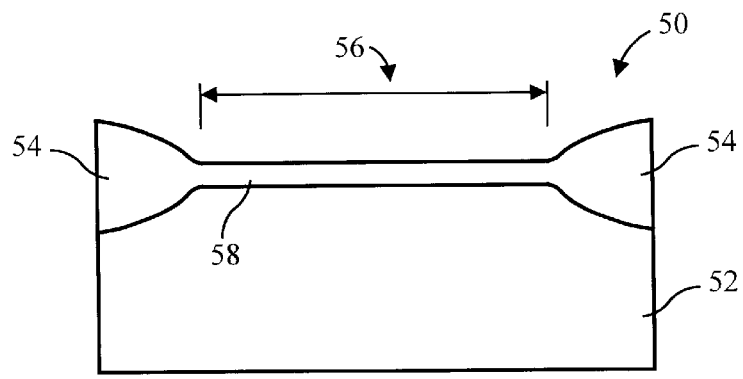
Figure 2C:
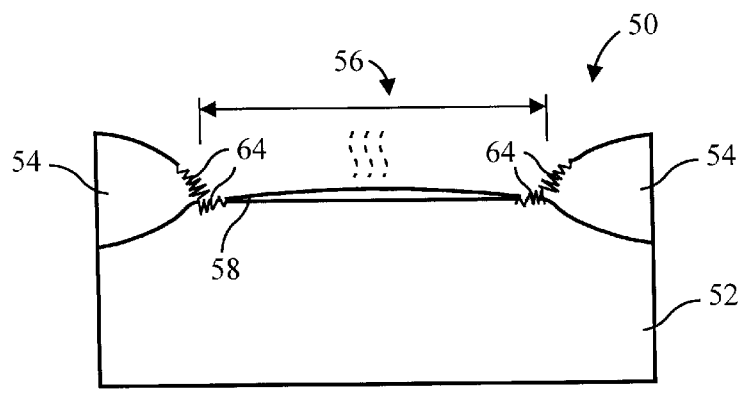
Figure 3A:
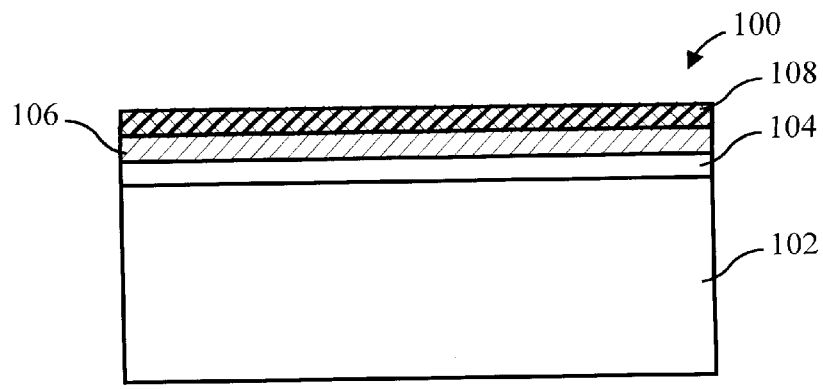
FIGS. 3A–3D illustrate cross-sectional views of an integrated circuit at sequential steps of an exemplary method of forming a field oxide and an active area in accordance with the invention.

FIGS. 3A–3D illustrate cross-sectional views of an integrated circuit 100 at sequential steps of an exemplary method of forming a field oxide and an active area in accordance with the invention. As illustrated in FIG. 3A, a first preferred procedure in the exemplary method of forming a field oxide is to form a pad oxide layer (e.g. $SiO_2$) 104 on and over a substrate 102 (e.g. p-type substrate), a polysilicon layer 106 on and over the pad oxide 104, and a silicon nitride ($Si_3N_4$) 108 on and over the polysilicon layer 106.

In the preferred embodiment, the pad oxide layer 104 is thermally grown to a thickness of about 100 to 400 Angstroms, at a temperature of about 700 to 1000 degrees Celsius. Also, in the preferred embodiment, the polysilicon layer 106 is formed by low pressure chemical vapor deposition (LPCVD) using $SiH_4$ as the reactive gas, at a pressure of about 200 mTorr, and a temperature of about 620 degrees Celsius, to achieve a thickness of about 100 to 600 Angstroms. In addition, in the preferred embodiment, the silicon nitride ($Si_3N_4$) 108 is formed by low pressure chemical vapor deposition (LPCVD) using $SiH_2Cl_2$ and $NH_3$ as reactive gases, at a pressure of about 350 mTorr, and a temperature of about 760 degrees Celsius, to achieve a thickness of about 1500 to 2500 Angstroms.

Figure 3B:
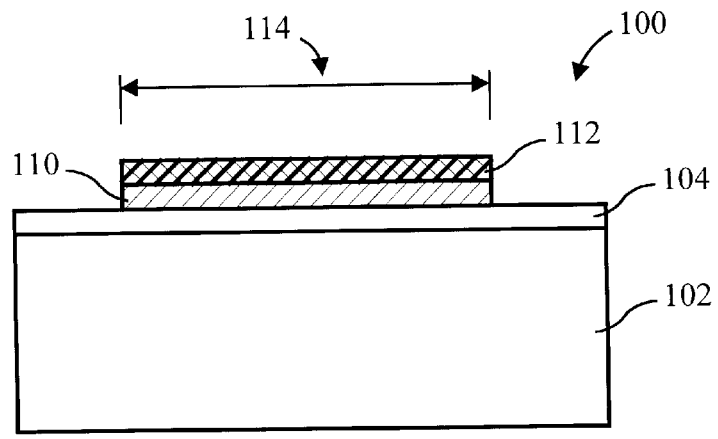

As illustrated in FIG. 3B, a subsequent procedure in the exemplary method of forming a field oxide and an active area in accordance with the invention is to perform the step of substantially removing respective portions of the silicon nitride ($Si_3N_4$) 108 and the polysilicon layer 106 at the region(s) where the field oxide is to be formed. In the preferred embodiment, the removal of respective portions of the silicon nitride ($Si_3N_4$) 108 and the polysilicon layer 106 is performed by a photolithography step and anisotropic etching step using Lam Research Rainbow model 4,250 machine, at a pressure of about 400 mTorr, at a power of about 525 watts, and using Ar at a flowrate of about 320 sccm, $CHF_3$ at a flowrate of about 20 sccm, and $O_2$ at a flowrate of about 50 sccm as reactive gases. At least some of the remaining silicon nitride ($Si_3N_4$) 108 forms a mask 112 for a subsequent oxidation step, and at least some of the remaining polysilicon layer 106 form a polysilicon buffer 110, both in a substantially stacked arrangement to define the active area 114 in a self-aligned manner.

Figure 3C:
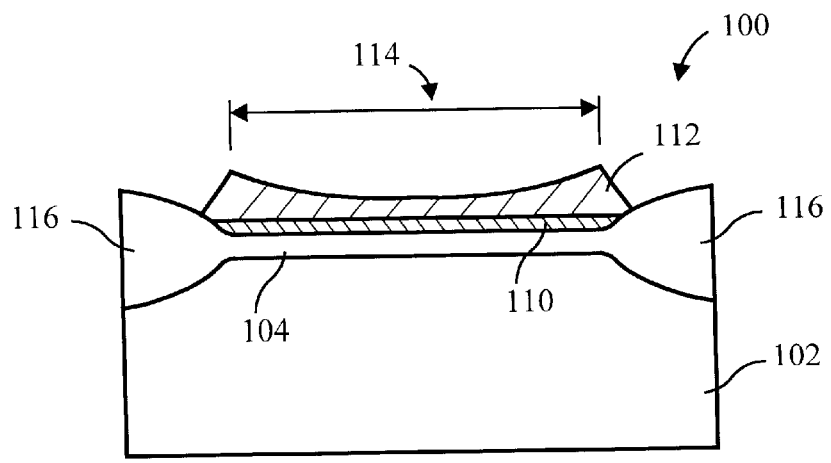

As illustrated in FIG. 3C, a subsequent procedure in the exemplary method of forming a field oxide and an active area in accordance with the invention is to perform the step of forming the field oxide 116 proximate the active area 114, or in the field oxide region as defined by the removal of the silicon nitride ($Si_3N_4$) 108 and the polysilicon layer 106 discussed in the previous paragraph. The field oxide 116 can be formed in a number of ways, but preferably by oxidizing polysilicon material (not shown) formed in the field oxide region by using the silicon nitride ($Si_3N_4$) mask 112 as a mask, and at a temperature of about 1000 degrees Celsius, for approximately 150 to 480 minutes, to achieve a thickness of about 3500 to 6000 Angstroms. This process is typically known in the relevant art as a local oxidation of silicon (LOCOS).

Figure 3D:
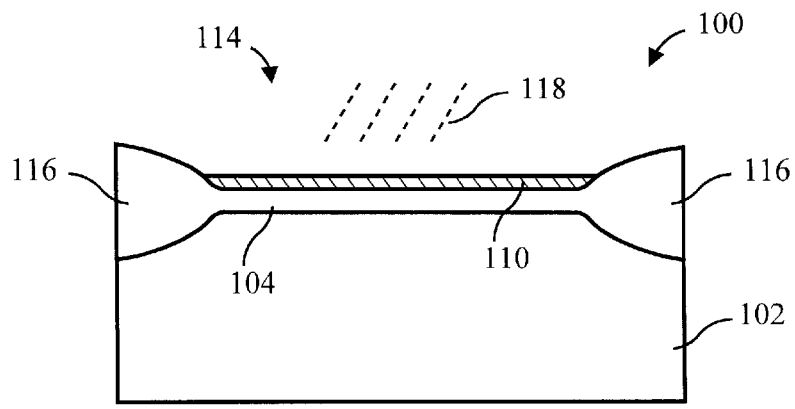

As illustrated in FIG. 3D, a subsequent procedure in the exemplary method of forming a field oxide 116 and an active area 114 in accordance with the invention is to perform the step of substantially removing the silicon nitride ($Si_3N_4$) mask 112 and the polysilicon buffer 110 without substantially forming pits in either the field oxide 116, the pad oxide 104, or the substrate 102. In the preferred embodiment, the removal of the silicon nitride ($Si_3N_4$) mask 112 is performed by wet etching using a heated solution of $HPO_3$. The following step describes an exemplary method of substantially removing the polysilicon buffer 110 as part of the method of forming the field oxide and an active area in accordance with the invention.

The exemplary method of substantially removing the polysilicon buffer 110 in accordance with the invention comprises the step of applying an etching selectivity solution 118 to the polysilicon buffer 110 to substantially remove this material. An etching selectivity solution as defined herein is a solution that has a higher etching rate for one material, and a lower etching rate for another material. In this case, the etching selectivity solution 118 has an etching rate that is higher for polysilicon material than for the field oxide 116 and pad oxide 104 materials. As a result, the etching selectivity solution 118 etches off the polysilicon buffer 110 without substantially affecting the field oxide 116, the pad oxide 104, and the substrate 102. In the preferred embodiment, the etching selectivity solution 118 comprises a mixture of HF and $HNO_3$. Alternatively, the etching selectively solution is a combination of the group comprising HF, $HNO_3$ and $CH_3COOH$. The preferred etching selectivity solution 118 has a polysilicon/oxide etching rate ratio (ERR) of about 13 to 18.

An advantage of the exemplary method of substantially removing the polysilicon buffer 110 in accordance with the invention is that there is a substantial reduction in the likelihood that pits will form in the field oxide 116, the pad oxide 104, and/or the substrate 102. As a result, the integrated circuit 100 formed in accordance with the invention is generally more reliable than those formed with the prior art method previously discussed. In particular, the absence or at least the reduction of pits in the field and pad oxides 104 and 116 and in the substrate 102 reduces the likelihood of leakage currents. Furthermore, the absence or at least the reduction of pits in these materials also generally improves the charge-to-breakdown voltage Qbd.

Figure 4:
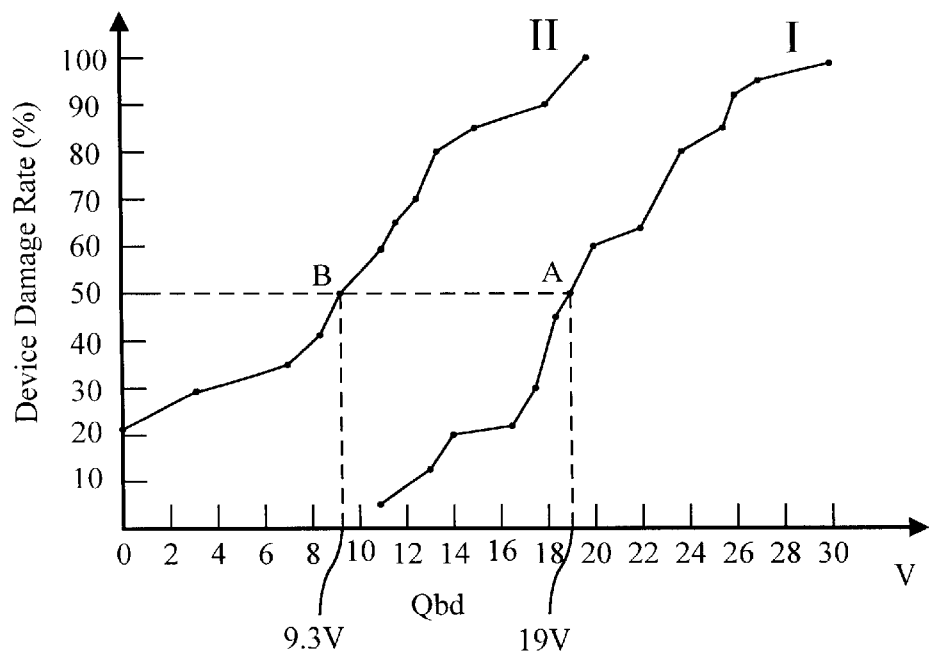
FIG. 4 illustrates a graph comparing the performance of an integrated circuit manufactured in accordance with the invention with that of an integrated circuit manufactured by a prior art methodology.

FIG. 4 illustrates a graph comparing the charge-to-breakdown voltage Qbd of an integrated circuit manufactured in accordance with the invention with that of an integrated circuit manufactured by a prior art methodology. The x-axis of the graph represents the charge-to-breakdown voltage Qbd measured in Volts. The y-axis of the graph represents the device damage rate measured in percentage. The measurements identified with Roman numeral I represents measured data taken off a device manufactured in accordance with the invention. Whereas, the measurements identified with Roman numeral II represents measured data taken off a device manufactured in accordance with a prior art technique.

FIG. 4 illustrates that the charge-to-breakdown voltage Qbd of the device manufactured in accordance with the invention is substantially greater than a device manufactured in accordance with a prior art methodology. For instance, taking a 50 percent device damage rate, the graph illustrates that the charge-to-breakdown voltage Qbd for the device manufactured in accordance with the invention is about 19 Volts (indicated on the graph as point A). Whereas, for the device manufactured in accordance with the prior art technique, the charge-to-breakdown voltage Qbd is only about 9.3 volts (indicated on the graph as point B). Thus, the reliability and performance aspects of the device manufactured in accordance with the invention appear substantially improved over that of the device manufactured in accordance with a prior art technique.

While the invention has been described in connection with various embodiments, it will be understood that the invention is capable of further modifications. This application is intended to cover any variations, uses or adaptation of the invention following, in general, the principles of the invention, and including such departures from the present disclosure as come within known and customary practice within the art to which the invention pertains.

What is claimed is:

1. A method of forming a field oxide and an active area for an integrated circuit, comprising:

forming a layer of silicon dioxide over a substrate;

forming a layer of polysilicon over said silicon dioxide layer;

forming a layer of silicon nitride over said polysilicon layer;

substantially removing said silicon nitride and polysilicon layers over said substrate in a region where said field oxide is to be formed, wherein at least a portion of the remaining silicon nitride layer and remaining polysilicon layer form respectively a silicon nitride mask and a polysilicon buffer configured in a substantially stacked manner to substantially define said active area;

forming a field oxide in said field oxide region;

substantially removing said silicon nitride mask; and applying an etching selectivity solution to said polysilicon buffer to substantially remove said polysilicon buffer without substantially affecting said field oxide, said etching selectivity solution including at least one component selected from the group consisting essentially of $HPO_3$, $HNO_3$, and $CH_3 COOH$.

2. The method of claim 1, wherein said etching selectivity solution comprises a mixture including at least HF.

3. The method of claim 2, wherein said etching selectivity solution further includes $HNO_3$.

4. The method of claim 3, wherein said etching selectivity solution further includes $CH_3COOH$.

5. The method of claim 1, wherein said etching selectivity solution comprises a mixture of any combination from the group comprising HF, $HNO_3$ and $CH_3COOH$.

6. The method of claim 1, wherein said etching selectively solution has a polysilicon to oxide etching rate ratio of about 13 to 18.

7. The method of claim 1, wherein the step of substantially removing said silicon nitride mask comprises the step of wet etching said silicon nitride mask using a heated solution of $HPO_3$.

8. The method of claim 1, wherein the step of forming said silicon nitride layer comprises the step of forming silicon nitride material to a thickness of about 1500 to 2000 Angstroms by a low pressure chemical vapor deposition using $SiH_2Cl_2$ and $NH_3$, at a temperature of about 760 degrees Celsius, and at a pressure of about 350 mTorr.

9. The method of claim 1, wherein the step of forming said polysilicon layer comprises the step of forming polysilicon material using low pressure chemical vapor deposition using $SiH_4$, at a pressure of about 200 mTorr, and at a temperature of about 620 degres Celsius.

10. The method of claim 1, wherein the step of forming said silicon dioxide layer comprises the step of thermally growing said silicon dioxide layer to a thickness of about 100 to 400 Angstroms, at a temperature of about 700 to 1000 degrees Celsius.

11. The method of claim 1, wherein the step of substantially removing said silicon nitride layer and said polysilicon layer comprises a step of anisotropic etching said silicon nitride layer and said polysilicon layer using Ar at a flowrate of about 320 sccm, $O_2$ at a flowrate of about 50 sccm, and $CHF_3$ at a flowrate of about 20 sccm, at a pressure of about 400 mTorr.

12. The method of claim 1, wherein the step of forming said field oxide includes the step of oxidizing polysilicon material at a temperature of about 1000 degrees Celsius, for approximately 150 to 480 minutes, to achieve a thickness of about 3500 to 6000 Angstroms for the field oxide.

13. A method for removing a polysilicon buffer in a process of forming a field oxide and an active area, comprising the steps of:

applying an etching selectivity solution to said polysilicon buffer for removing said polysilicon buffer without substantially affecting said field oxide, said etching selectivity solution including at least one component selected from the group consisting essentially of $HPO_3$, $HNO_3$, HF and $CH_3COOH$.

14. The method of claim 13, wherein said etching selectivity solution comprises a mixture including at least HF.

15. The method of claim 14, wherein said etching selectivity solution further includes $HNO_3$.

16. The method of claim 15, wherein said etching selectivity solution further includes $CH_3COOH$.

17. The method of claim 13, wherein said etching selectivity solution comprises a mixture of any combination from the group comprising HF, $HNO_3$ and $CH_3COOH$.

18. The method of claim 13, wherein said etching selectively solution having a polysilicon to oxide etching rate ratio of about 13 to 18.

19. A method of forming a field oxide and an active area, comprising the steps of:

forming a polysilicon buffer and an oxidation mask over a substrate in a substantially stacked arrangement within said active area and proximate a region of said substrate where said field oxide is to be formed;

forming a field oxide within said field oxide region;

substantially removing said oxidation mask; and substantially removing said polysilicon buffer using an etching selectivity solution said etching selectivity solution including at least one component selected from the group consisting essentially of $HPO_3$, $HNO_3$, HF and $CH_3COOH$.

20. The method of claim 19, wherein said etching selectivity solution comprises a mixture including at least HF.

21. The method of claim 20, wherein said etching selectivity solution further includes $HNO_3$.

22. The method of claim 21, wherein said etching selectivity solution further includes $CH_3COOH$.

23. The method of claim 19, wherein said etching selectivity solution comprises a mixture of any combination from the group comprising HF, $HNO_3$ and $CH_3COOH$.

24. The method of claim 19, wherein said etching selectively solution having a polysilicon to oxide etching rate ratio of about 13 to 18.

25. The method of claim 19, wherein the step of forming said oxidation mask comprises the steps of:

depositing a layer of silicon nitride over said substrate; and substantially removing a portion of said silicon nitride layer over said substrate and within said field oxide region, whereby at least a portion of the remaining silicon nitride layer forms said oxidation mask.

26. The method of claim 25, wherein the step of substantially removing said portion of said silicon nitride layer includes the step of anisotropic etching said silicon nitride layer.

27. The method of claim 19, wherein the step of forming said polysilicon buffer comprises the step of depositing polysilicon material using low pressure chemical vapor deposition.

28. The method of claim 19, wherein the step of forming said field oxide comprises the step of subjecting a polysilicon material to an oxygen environment at a temperature of about 1000 degrees Celsius.

29. The method of claim 19, wherein the step of substantially removing said oxidation mask comprises the steps of subjecting said oxidation mask to a heated solution of $HPO_3$.

* * * * *